(12) United States Patent
Langford

(10) Patent No.: US 7,299,473 B2
(45) Date of Patent: Nov. 20, 2007

(54) METHOD AND APPARATUS FOR REDUCING LIBRARY SIZE ON A COMPRESSED FILE SYSTEM

(75) Inventor: John Steven Langford, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 719 days.

(21) Appl. No.: 10/411,446

(22) Filed: Apr. 10, 2003

(65) Prior Publication Data

US 2004/0205763 A1    Oct. 14, 2004

(51) Int. Cl.
G06F 3/00     (2006.01)
G06F 12/00    (2006.01)

(52) U.S. Cl. ...................... 719/310; 711/170
(58) Field of Classification Search ............... 719/310; 711/170
See application file for complete search history.

(56) References Cited

U.S. PATENT DOCUMENTS

| | | | | |
|---|---|---|---|---|
| 4,426,688 A | * | 1/1984 | Moxley | 365/200 |
| 6,102,966 A | * | 8/2000 | Tyma | 717/110 |
| 6,216,213 B1 | * | 4/2001 | Breternitz et al. | 711/170 |
| 6,907,589 B2 | * | 6/2005 | Frank et al. | 716/5 |
| 6,907,598 B2 | * | 6/2005 | Fraser | 717/127 |

* cited by examiner

*Primary Examiner*—William Thomson
*Assistant Examiner*—LeChi Truong
(74) *Attorney, Agent, or Firm*—Duke W. Yee; Diana R. Gerhardt; Lisa L.B. Yociss

(57) ABSTRACT

A method, apparatus, and computer instructions for managing a library in a data processing system that supports file compression. Functions in the library that are unrequired on the data processing system are identified to form a set of identified functions. Existing data for the set of identified functions in the library is overwritten with new data that is more compressible than the code, wherein compression of the library by the data processing system results in a library with a smaller size.

3 Claims, 2 Drawing Sheets

METHOD AND APPARATUS FOR REDUCING LIBRARY SIZE ON A COMPRESSED FILE SYSTEM

BACKGROUND OF THE INVENTION

1. Technical Field

The present invention relates to an improved data processing system, and in particular to a method, apparatus, and computer instructions for managing libraries. Still more particularly, the present invention provides a method, apparatus, and computer instructions for managing libraries on a compressed file system.

2. Description of Related Art

Data processing systems come in many different forms. Some data processing systems take the form of web servers and mainframes. On the other end of the spectrum are embedded computer system environments. Embedded systems typically do not take the form of a desktop computer. An embedded system is a combination of hardware and software that performs a specific function. This embedded system may be part of a computer or part of some other system that is not a computer. For example, an embedded system may be present in various devices, such as routers, biomedical appliances, cellular phones, personal digital assistants (PDAs), cameras, and camcorders.

In an embedded computer system environment, storage space is very limited. As a result, it is important to reduce the size of programs and data stored on those systems. File systems on embedded systems often use compression to save space. A file system is a mechanism for cataloging files in a computer.

One of the major consumers of space is the set of standard libraries, which provide a vast array of generic functions for applications. It is not unusual for these types of libraries to contain thousands of functions. Many of these functions, however, are not applicable, or are simply not used in a specific embedded system. As a result, a large amount of wasted space occurs in using these libraries.

Some techniques are currently available to minimize the waste of space with respect to libraries. These existing techniques include creating or rebuilding the library with only the required functions being included in the library. Another technique involves physically removing the unused functions in a library, compacting the library, and then readjusting a symbol table for the library.

Although these two techniques reduce the space required for a library, they both have drawbacks. Rebuilding a library requires that the source code for the library functions be available. In many cases, source codes for libraries are not provided or are hard to find. Having the source code available also requires that the library source code be kept under source code control to maintain quality control. Rebuilding also requires additional compilation time. The second technique requires readjustment of the symbol table or tables to accommodate the new locations of the remaining functions. Although such a task can be accomplished, this process is cumbersome, error prone and makes debugging more complex.

Therefore, it would be advantageous to have an improved method, apparatus, and computer instructions for managing a library in a manner to reduce the space required to store a library in a data processing system.

SUMMARY OF THE INVENTION

The present invention provides a method, apparatus, and computer instructions for managing a library in a data processing system that supports file compression. Functions in the library that are unrequired on the data processing system, are identified to form a set of identified functions. Existing data for the set of identified functions in the library is overwritten with new data that is more compressible than the code, wherein compression of the library by the data processing system results in a library with a smaller size.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
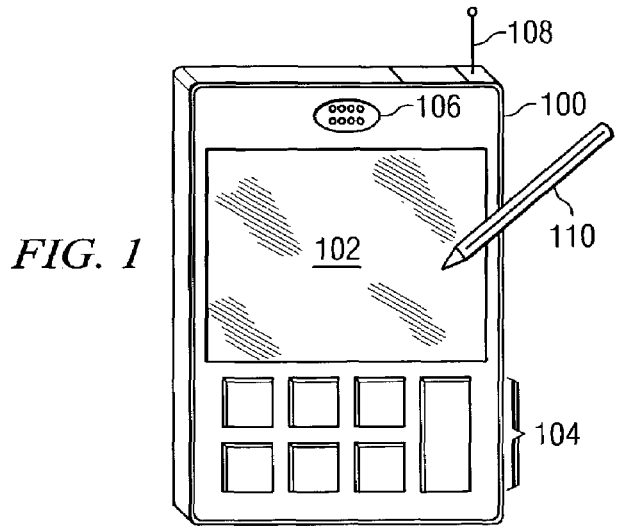
FIG. 1 is a diagram of an embedded computing system in the form of a personal digital assistant (PDA) in accordance with a preferred embodiment of the present invention.

With reference now to the figures, and in particular with reference to FIG. 1, a diagram of an embedded computing system in the form of a personal digital assistant (PDA) is depicted in accordance with a preferred embodiment of the present invention. PDA 100 includes a display 102 for presenting textual and graphical information. Display 102 may be a known display device, such as a liquid crystal display (LCD) device. The display may be used to present a map or directions, calendar information, a telephone directory, or an electronic mail message. In these examples, screen 102 may receive user input using an input device such as, for example, stylus 110.

PDA 100 may also include keypad 104, speaker 106, and antenna 108. Keypad 104 may be used to receive user input in addition to using screen 102. Speaker 106 provides a mechanism for audio output, such as presentation of an audio file. Antenna 108 provides a mechanism used in establishing a wireless communications link between PDA 100 and a network.

PDA 100 also preferably includes a graphical user interface that may be implemented by means of systems software residing in computer readable media in operation within PDA 100.

Figure 2:
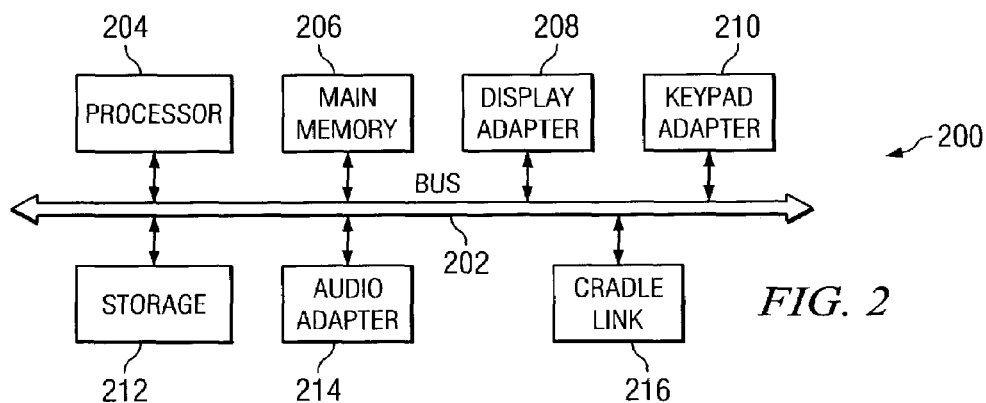
FIG. 2 is a block diagram of a PDA in accordance with a preferred embodiment of the present invention.

Turning now to FIG. 2, a block diagram of a PDA is shown in accordance with a preferred embodiment of the present invention. PDA 200 is an example of a PDA, such as PDA 100 in FIG. 1, in which code or instructions implementing the processes of the present invention may be located. PDA 200 includes a bus 202 to which processor 204 and main memory 206 are connected. Display adapter 208, keypad adapter 210, storage 212, and audio adapter 214 also are connected to bus 202. Cradle link 216 provides a mechanism to connect PDA 200 to a cradle used in synchronizing data in PDA 200 with another data processing system. Further, display adapter 208 also includes a mechanism to receive user input from a stylus when a touch screen display is employed.

An operating system runs on processor 204 and is used to coordinate and provide control of various components within PDA 200 in FIG. 2. The operating system may be, for example, a commercially available operating system such as Windows CE, which is available from Microsoft Corporation. Instructions for the operating system and applications or programs are located on storage devices, such as storage 212, and may be loaded into main memory 206 for execution by processor 204.

Those of ordinary skill in the art will appreciate that the hardware in FIG. 2 may vary depending on the implementation. Other internal hardware or peripheral devices, such as flash ROM (or equivalent nonvolatile memory) or optical disk drives and the like, may be used in addition to or in place of the hardware depicted in FIG. 2.

Further, the mechanism of the present invention may be implemented in other types of embedded computing systems, other than PDA 200. The illustration of a PDA is made for the purpose of providing an example hardware platform in which the mechanism of the present invention may be implemented. The present invention may be implemented on other embedded computer systems, such as, for example, a cellular phone, a camera, a printer, a router, or a set-top box. Additionally, the mechanism of the present invention may be applied to other data processing systems in which a compressed file system is present.

Figure 3:
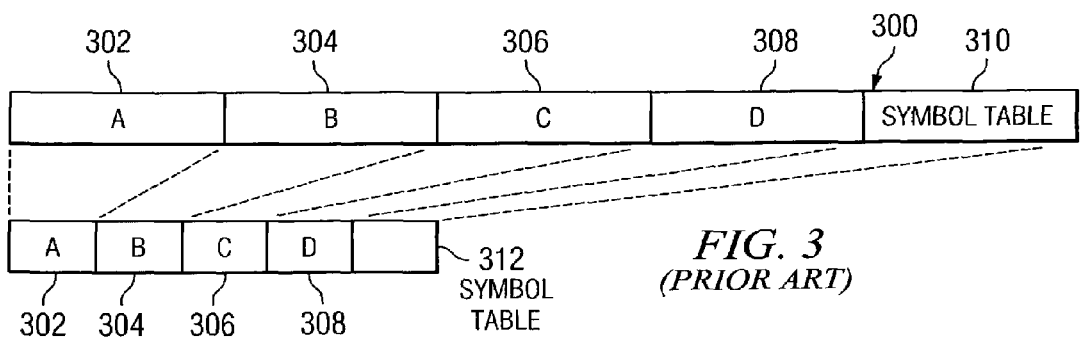
FIG. 3 is a diagram illustrating an example library before and after compression.

With reference to FIG. 3, a diagram illustrating an example library before and after compression is shown. In this example, library 300 contains functions A 302, B 304, C 306, and D 308. Additionally, library 300 also includes symbol table 310. After compression by the file system, compressed library 312 is formed, which has a smaller size than library 300, as illustrated in FIG. 3. As can be seen, all of the same functions found in library 300 are still present within compressed library 312. The size of library 300 has been reduced through compression performed by the file system.

Figure 4:
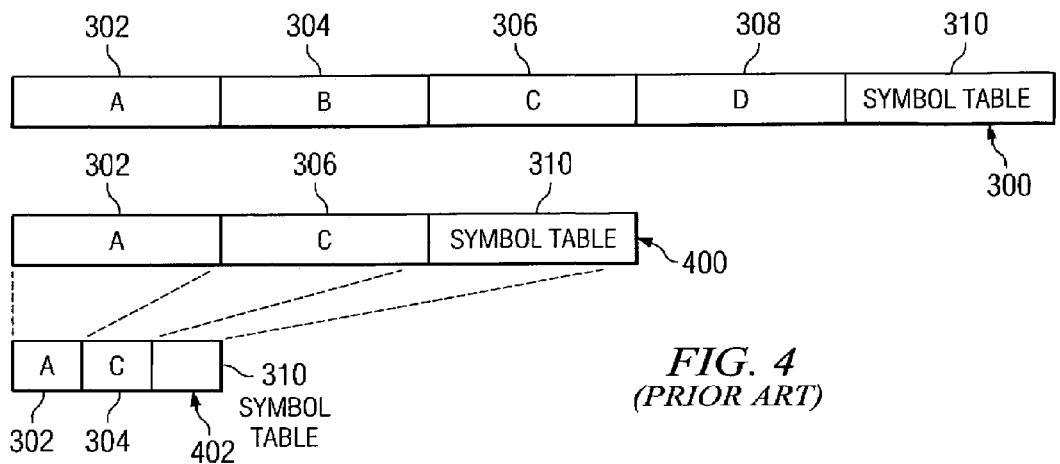
FIG. 4 is a diagram illustrating the use of an existing technique to reduce library size.

Turning now to FIG. 4, a diagram illustrating the use of an existing technique to reduce library size is illustrated. Although library 300 was reduced in size, as shown in FIG. 3 through compression, further reductions can be had by removing functions or rebuilding the library. Through rebuilding or removing functions, library 400 is created, in which library 400 contains function A 302 and function C 306, along with symbol table 310. When library 400 is compressed, compressed library 402 is formed, which has a smaller size than library 400. As can be seen, gains in the amount of size reduced may be accomplished through rebuilding the library or removing functions. These techniques have the complexity and cumbersomeness as described above.

The present invention overcomes the complexity and cumbersomeness of the presently available techniques because rebuilding of the library or removal of the functions do not occur. The present invention takes advantage of compression already used by such a data processing system by replacing unused functions with data that compresses extremely well. For example, a run or a string containing a repetition of a single byte value may be used to replace the data for the unrequired function. For example, a repeating series of binary zeros may be used. A repeating run of a letter "a" may be used depending on the particular implementation. This mechanism does not require readjustment of the symbol table because functions are not removed.

Figure 5:
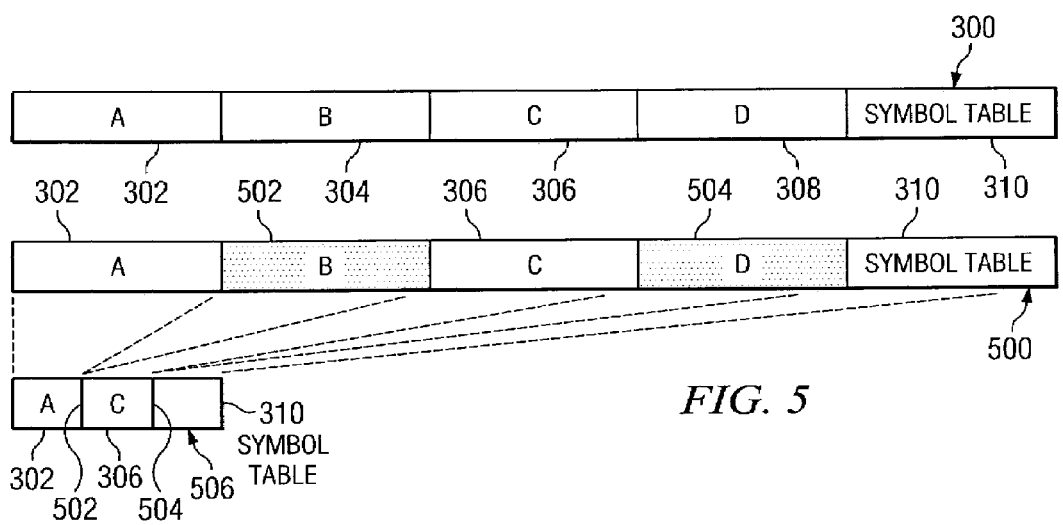
FIG. 5 is a diagram illustrating a technique for reducing library sizes in accordance with a preferred embodiment of the present invention.

Turning now to FIG. 5, a diagram illustrating a technique for reducing library sizes is depicted in accordance with a preferred embodiment of the present invention. In this example, library 300 is modified to form modified library 500. As with library 400, function A 302 and function C 306 are required functions, while function B 304 and function D 308 are unrequired functions in the library. In this example, the data for function B 304 and function D 308 are replaced with easily compressible data 502 and 504.

In these examples, easily compressible data 502 and 504 may take the form of a string or run of a repeating single byte value. For example, binary zeros may be used for easily compressible data 502 and 504. Of course, any consistent value may be employed in these examples. After compression by the file system, compressed library 506 is formed having a size that is smaller than compressed library 312. The normal compression ratio is a little over 3 to 1 with a library that is not modified. When a library is modified according to the present invention, such as with a series of binary zeros the compression ratio reaches a ratio of about 1000 to 1 for those areas in which functions are replaced with the binary zeros. The amount of compression also will depend on the type of compression algorithm used.

Figure 6:
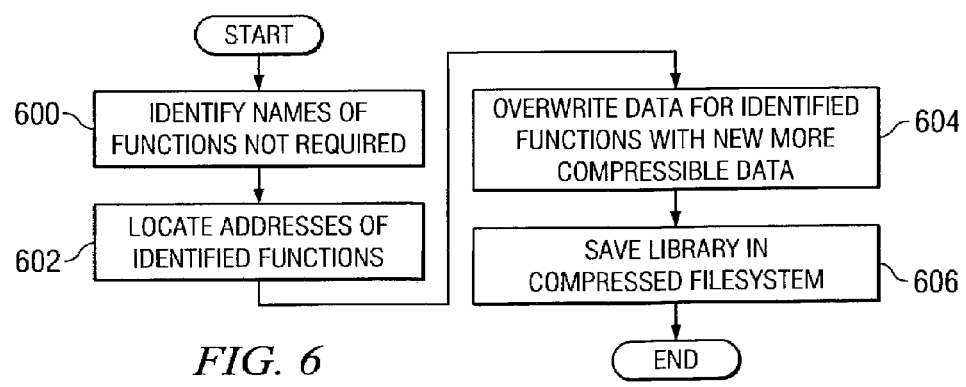
FIG. 6 is a flowchart of a process for reducing the size of a library for a compressed file system in accordance with a preferred embodiment of the present invention.

With reference now to FIG. 6, a flowchart of a process for reducing the size of a library for a compressed file system is depicted in accordance with a preferred embodiment of the present invention. The process illustrated in FIG. 6 may be implemented in a data processing system, such as PDA 200 in FIG. 2 or on a data processing system, such as a desk top computer or a work station. Further, this process may be implemented on a data processing system in which file compression does not occur with the modified library being saved to a system on which a compressed file system is present.

The process begins by identifying names of functions not required (step 600). Thereafter, addresses of identified functions are located (step 602). Addresses may be found inside the symbol table. After the addresses have been located, the data for the identified functions are overwritten with new and more compressible data (step 604). Thereafter, the library is saved in the compressed file system (step 606), with the process terminating thereafter.

Thus, the present invention provides a method, apparatus, and computer instructions for library size reduction on a compressed file system. The mechanism of the present invention allows for increased compression of libraries without requiring the cumbersome and complex processes involved with creating or rebuilding a library with only the required functions or with physically removing unused functions within a library. The mechanism of the present invention provides this advantage by replacing the data for unrequired functions with easily compressible data. In this manner, readjustment of the symbol table is not required and by providing data that is easily compressible, the library is reduced in size by taking advantage of the compression system already present for the file system.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, and DVD-ROMs. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method in a data processing system for managing a library, the method comprising:

the data processing system being an embedded computer system in the form of one of a personal digital assistant, a cellular phone, a camera, a printer, a router, and a set-top box;

the data processing system including a compressed file system that uses a compression system that exists within the data processing system;

identifying, by the data processing system, names of two or more of a plurality of functions in the library that are unused and not required on the data processing system;

the library including a symbol table;

locating, in the symbol table, an address of each one of the two or more of the plurality of functions after the address of each one of the two or more of the plurality of functions has been located: transforming, by the data processing system, said library by overwriting existing data in said two or more of said plurality of functions with new data that is more compressible than said existing data to form a transformed library, wherein the transformed library is not compressed;

the existing data and the new data being the same length;

using, as the new data, a string that is a repetition of only the letter "a";

compressing the transformed library using the existing compression system to form a compressed library;

the compressed library including all of the plurality of functions and the symbol table;

the symbol table not readjusted after the library is transformed to form the transformed library, and not readjusted after the transformed library is compressed to form the compressed library, wherein a new symbol table is not formed; and storing the compressed library in the data processing system.

2. A data processing system for managing a library, the data processing system comprising:

the data processing system being an embedded computer system in the form of one of a personal digital assistant, a cellular phone, a camera, a printer, a router, and a set-top box;

the data processing system including a compressed file system that uses a compression system that exists within the data processing system;

the data processing system identifying names of two or more of a plurality of functions in the library that are unused and not required on the data processing system;

the library including a symbol table;

the processor executing code for locating, in the symbol table, an address of each one of the two or more of the plurality of functions;

after the address of each one of the two or more of the plurality of functions has been located: the data processing system transforming the library by overwriting existing data in the two or more of the plurality of functions with new data that is more compressible than the existing data to form a transformed library, wherein the transformed library is not compressed;

the existing data and the new data being the same length;

the processor executing code for using, as the new data, a string that is a repetition of only the letter "a";

the processor executing code for compressing the transformed library using the existing compression system to form a compressed library;

the compressed library including all of the plurality of functions and the symbol table;

the symbol table not readjusted after the library is transformed to form the transformed library, and not readjusted after the transformed library is compressed to form the compressed library, wherein a new symbol table is not formed; and the processor executing code for storing the compressed library in the data processing system.

3. A computer program product that is stored in a computer readable storage media for managing a library in a data processing system, the computer program product comprising:

the data processing system being an embedded computer system in the form of one of a personal digital assistant, a cellular phone, a camera, a printer, a router, and a set-top box;

the data processing system including a compressed file system that uses a compression system that exists within the data processing system;

instructions for identifying, by the data processing system, names of two or more of a plurality of functions in the library that are unused and not required on the data processing system;

the library including a symbol table:

instructions for locating, in the symbol table, an address of each one of the two or more of the plurality of functions;

after the address of each one of the two or more of the plurality of functions has been located: instructions for transforming, by the data processing system, the library by overwriting existing data in the two or more of the plurality of functions with new data that is more compressible than the existing data to form a transformed library, wherein the transformed library is not compressed;

the existing data and the new data being the same length:

instructions for using, as the new data, a string that is a repetition of only the letter "a";

instructions for compressing the transformed library using the existing compression system to form a compressed library;

the compressed library including the plurality of functions and the symbol table;

the symbol table not readjusted after the library is transformed to form the transformed library, and not readjusted after the transformed library is compressed to form the compressed library, wherein a new symbol table is not formed; and instructions for storing the compressed library in the data processing system.

* * * * *